United States Patent
Wildner

(10) Patent No.: US 6,467,677 B1
(45) Date of Patent: Oct. 22, 2002

(54) METHOD AND CONTACT POINT FOR PRODUCING AN ELECTRICAL CONNECTION

(75) Inventor: Ingolf Wildner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,539

(22) PCT Filed: Mar. 2, 1999

(86) PCT No.: PCT/DE99/00556

§ 371 (c)(1),
(2), (4) Date: Nov. 1, 2000

(87) PCT Pub. No.: WO99/44782

PCT Pub. Date: Sep. 10, 1999

(30) Foreign Application Priority Data

Mar. 4, 1998 (DE) .......................................... 198 09 081

(51) Int. Cl.⁷ .......................... B23K 31/02; B23K 1/06; B23K 20/10
(52) U.S. Cl. ................................. 228/180.5; 228/110.1; 228/173.1
(58) Field of Search .............................. 228/180.5, 4.5, 228/110.1, 1.1, 155, 164, 173.1

(56) References Cited

U.S. PATENT DOCUMENTS

| | | | | |
|---|---|---|---|---|
| 3,934,108 A | * | 1/1976 | Howard | |
| 3,941,298 A | * | 3/1976 | Nicklaus | |
| 5,176,310 A | * | 1/1993 | Akiyama et al. | |
| 5,431,329 A | * | 7/1995 | Hasegawa et al. | |
| 5,842,628 A | * | 12/1998 | Nomoto et al. | |
| 5,874,354 A | * | 2/1999 | Heitzer et al. | |
| 5,938,952 A | * | 8/1999 | Lin et al. | |
| 5,960,262 A | * | 9/1999 | Torres et al. | |
| 5,981,371 A | * | 11/1999 | Yamazaki et al. | |
| 6,001,724 A | * | 12/1999 | Stansbury | |
| 6,270,000 B1 | * | 8/2001 | Nishiura | |

FOREIGN PATENT DOCUMENTS

| | | |
|---|---|---|
| DE | 20 64 289 | 1/1971 |
| EP | 0 810 293 | 12/1997 |
| JP | 405013491 A * | 1/1993 |

OTHER PUBLICATIONS

Joshi et al.., "All–ball Untrasonic and Thermocompression Bonds for interconnections" Nov. 6, 1970, pp. 1624, vol. 13, IBM Technical Disclosure Bulletin.

* cited by examiner

Primary Examiner—Tom Dunn
Assistant Examiner—Kiley Stoner
(74) Attorney, Agent, or Firm—Kenyon & Kenyon

(57) ABSTRACT

A method for making an electrical connection between a first contact surface and a second contact surface. A contacting wire is arranged between the contact surfaces with the assistance of a wire-bonding device by contacting the contacting wire initially with the first contact surface and then with the second contact surface, and subsequently cutting off the contacting wire with the assistance of the wire-bonding device. Provision is made for contact metallization composed of the material of the contacting wire to be produced on the second contact surface using the wire-bonding device prior to contacting the first contact surface.

6 Claims, 2 Drawing Sheets

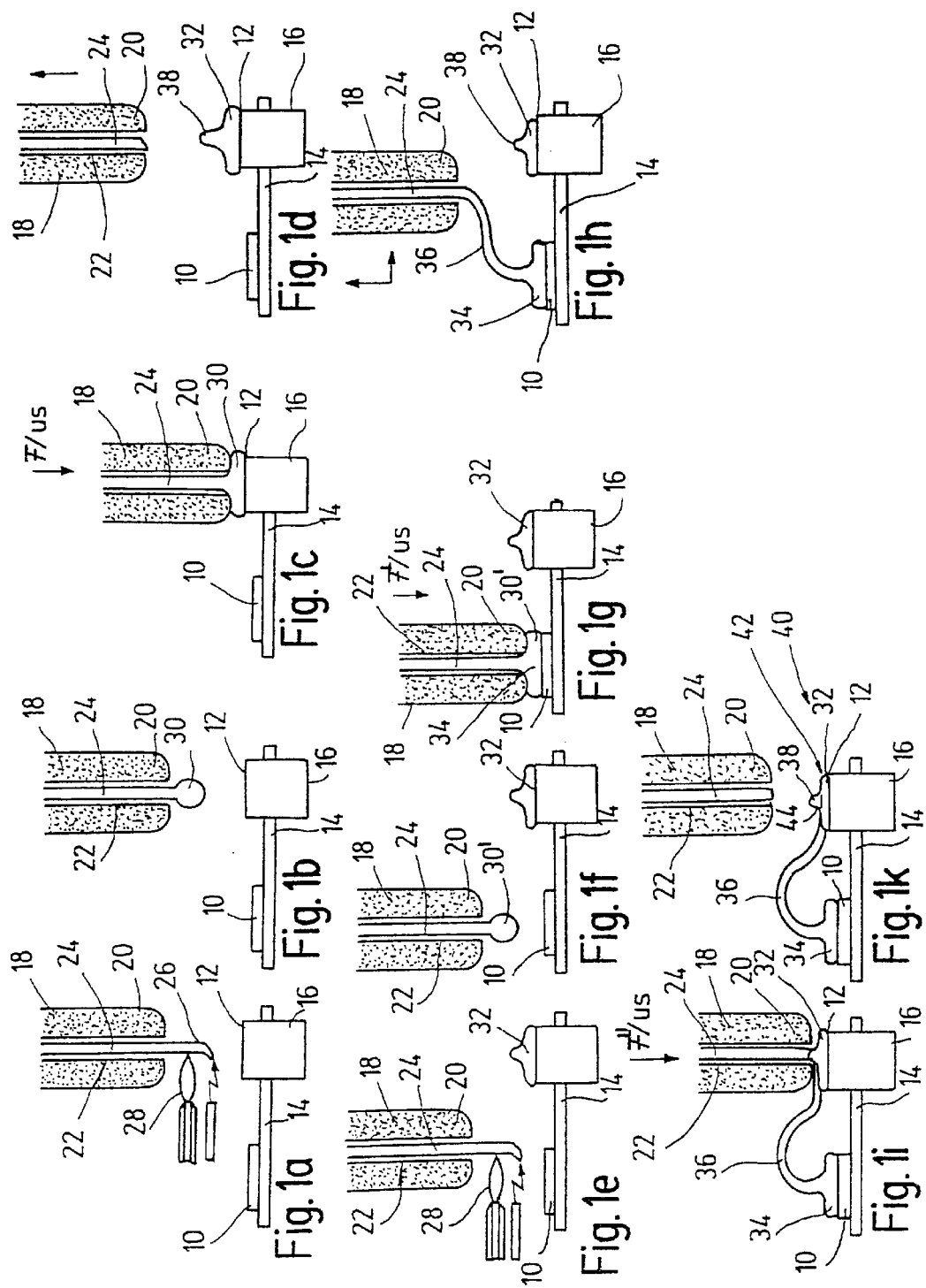

METHOD AND CONTACT POINT FOR PRODUCING AN ELECTRICAL CONNECTION

FIELD OF THE INVENTION

The present invention relates to a method for making an electrical connection and to a contact point.

BACKGROUND INFORMATION

For making an electrical connection between at least two contact points, a single wire contacting, a so-called "bonding" is known. In the process, using a wire-bonding device, single wires, in particular gold or aluminum wires are arranged between the contact surfaces like to be contacted. During bonding, the contacting wire is contacted with the contact surfaces under the influence of pressure, ultrasound, and temperature. The connecting wire is initially fused to form a ball at its free end by applying thermal energy, and is then pressed onto the first contact surface using a bonding capillary. In the process, the contacting wire binds to the contact surface by atomic binding forces developing at the interface between the contact surface and the contacting wire. During contacting with the first contact surface, the previously fused ball deforms into a "nail head". Subsequently, the contacting wire is led to the second contact surface using the wire-bonding device. In the process, the contacting wire is led loop to counteract a tearing off of the contacting wire at the first contact surface. The contacting wire is pressed onto the second contact surface using the wire-bonding device, once more under the influence of pressure, ultrasound, and temperature. In the process, the contacting wire is constricted in area so that it forms a predetermined breaking point at which the contacting wire tears subsequent to guiding the wire-bonding device away from the second contact surface. The contacting wire is connected to the second contact surface via a stitch, atomic binding forces developing again at the interface between the contacting wire and the second contact surface.

When working with this known, so-called "ball-wedge bonding" (ball-contacting with the first contact surface, stitch-contacting with the second contact surface), a strong material dependency exists between the contacting wire and the contact surfaces so that sufficiently great atomic binding forces develop at the interfaces. In particular during contacting the second contact surface, only a relatively small surface connection between the stitch and the contact surface is provided, which, can result in incorrect contactings in particular in the case of contact surfaces made of materials which are hard to bond.

SUMMARY OF THE INVENTION

The method according to the present invention has the advantage that the contact stability of the connection between the contacting wire and the second contact surface is significantly improved. By producing a contact metallization composed of the material of the contacting wire on the second contact surface using the wire-bonding device prior to contacting the first contact surface, this contact metallization is available for the later contacting of the contacting wire on the second contact surface. In particular, it is an advantage in this context that contacting can now be carried out between identical materials, namely the material of the contact metallization and of the contacting wire.

It is particularly preferred if the contact metallization is produced by applying a thermal energy to the free end of the contacting wire and subsequently pressing the contacting wire onto the second contact surface under the influence of ultrasonic energy. In this manner, a contact metallization which is used for the later contacting of the contacting wire is prepared at the second contact surface, the contact metallization abutting on the second contact surface over a relatively large surface because of its formation in principle known from the design of the contact point at the first contact surface. In this manner, materials which are hard to bond can also build up relatively great atomic binding forces at the interface between the second contact surface and the contact metallization, the atomic binding forces guaranteeing a high contact stability. The actual contacting of the contacting wire is then carried out on or with the contact metallization, great atomic binding forces being able to act at the interface between the contact metallization and the bonded contacting wire because of the identical materials even in the case of a relatively small contact surface of the contacting wire to be bonded.

It is a further advantage that, by previously producing the contact metallization, the wire-bonding device no longer comes directly into contact with the surface of the contact surface for generating the-necessary pressure during the actual contacting of the contacting wire at the second contact surface. Consequently, this is largely insensitive to topographical influences and substance properties of the contact surface.

Moreover, it is an advantage that, by previously applying the contact metallization for the subsequent contacting of the contacting wire, a metallically clean contact surface which is free of foreign contamination is provided so that an optimum interface connection of the contacting wire is possible.

Furthermore, it is advantageous that, by contacting the contacting wire onto the contact metallization which is composed of the same material, this interface connection can be carried out at room temperature, i.e., without supplying an additional thermal energy during the contacting of the contacting wire since sufficiently great atomic binding forces can be attained already under contact pressure at room temperature. If required, an additional, in principle not necessary supply of a thermal energy can of course take place.

In a further preferred embodiment of the present invention, provision is made for shape features to be stamped onto the contact metallization during its application to the contact surface, the shape features supporting a subsequent contacting of the contacting wire. In this manner, a positive-locking connection between the contacting wire and the contact metallization is advantageously enabled which already allows electrical contacting. A pressure to be applied to the contact point via the wire-bonding device can consequently be limited to the pressure that is sufficient for making the predetermined breaking point of the contacting wire. A higher contact pressure required for attaining an integral connection (atomic binding forces) between the contact metallization and the contacting wire can be dropped, at least be reduced.

Using a contact point, electrical contacting by bonding is advantageously made possible between a contacting wire and a contact surface of different materials of which, due to existing material properties, only low atomic binding forces can be expected at the interface. Because the contact point has a quantity of a contact material, this quantity of the contact material is contacted with the contact surface by an integral connection, the contacting wire is contacted with the quantity of the contact material, and the contacting wire and the contact material are composed of the same material, it is advantageously achieved that, by providing the contact material, a mediation is carried out between the different material properties of the contact surface and of the contacting wire. In this context, in particular because the contact material is applied to the contact surface over a relatively large surface, a good interface connection, i.e., a connection having high contact stability can be carried out even in the case of unfavorable material combinations. Because of the identical material of the contact material and the contacting wire, a later, relatively small contact surface between the contact material and the contacting wire is uncritical for a reliable connection of the contacting wire by bonding.

BRIEF DESCRIPTION OF THE DRAWINGS

FIG. 1a shows a process step of the method according to the present invention in a schematic view.

FIG. 1b shows a process step of the method according to the present invention in a schematic view.

FIG. 1c shows a process step of the method according to the present invention in a schematic view.

FIG. 1d shows a process step of the method according to the present invention in a schematic view.

FIG. 1e shows a process step of the method according to the present invention in a schematic view.

FIG. 1f shows a process step of the method according to the present invention in a schematic view.

FIG. 1g shows a process step of the method according to the present invention in a schematic view.

FIG. 1h shows a process step of the method according to the present invention in a schematic view.

FIG. 1i shows a process step of the method according to the present invention in a schematic view.

FIG. 1k shows a process step of the method according to the present invention in a schematic view.

DETAILED DESCRIPTION

Figure 2A:
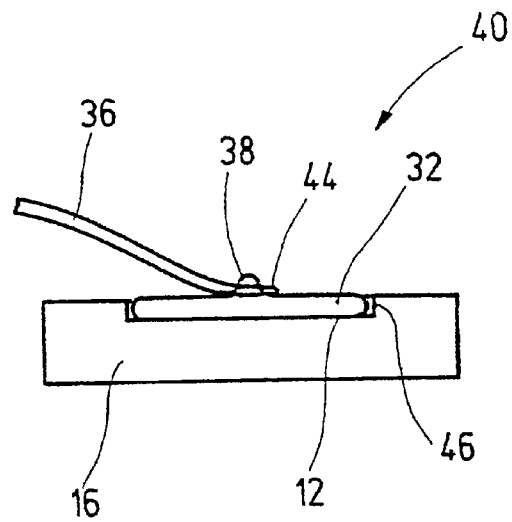
FIG. 2a shows an enlarged representation of a contact point.

FIG. 1 shows, in individual phases, a method for making an electrical connection between a first contact surface 10 and a second contact surface 12. Contact surface 10 is arranged on a substrate 14, for example, a microchip, whereas second contact surface 12 is arranged on a substrate 16, for example, a housing part of a microhybrid component. Contact surface 10 is composed, for example, of a gold pad, whereas contact surface 12 is composed, for example, of an aluminum pad.

The electrical connection between contact surfaces 10 and 12 is carried out using a wire-bonding device 18 which is shown here only schematically. Such wire-bonding devices are generally known so that their construction and function will not be discussed in detail within the scope of the description. Wire-bonding device 18 has a capillary mouthpiece 20 having a wire-guiding opening 22. In this context, wire-guiding opening 22 can run, for example, coaxially to a longitudinal axis of capillary mouthpiece 20. According to other exemplary embodiments, however, wire-guiding opening 22 can also be arranged at an angle to the longitudinal axis of capillary mouthpiece 20. A contacting wire 24 is guided through wire-guiding opening 22. Contacting wire 24 is composed, for example, of gold. Using a feeding device (not shown), contacting wire 24 can be proportioned through feed-through opening 22 so that the explained method for making the electrical connection between contact surfaces 10 and 12 can be made repeatedly, and a plurality of such connections can be made in a corresponding chronological succession. In the process, contacting wire 24 is taken from a supply which is not shown.

The process steps required for making the electrically conductive connection are explained on the basis of FIGS. 1a through 1k. Initially, according to FIG. 1a, wire-bonding device 18 is positioned above second contact surface 12. A free end 26 of contacting wire 24 protruding from wire-guiding opening 22 is heated to over the melting point of contacting wire 24 using a schematically indicated thermal energy source 28. Thermal energy source 28 can be, for example, a flame or an electric spark. The melted mass of contacting wire 24 contracts to form a ball 30 in response to a surface tension. According to the process step illustrated in FIG. 1c, wire-bonding device 18 is moved in the direction of second contact surface 12 so that ball 30 is plastically deformed. In the process, a force F and ultrasound US are applied to wire-bonding device 18. Due to the influence of force and ultrasound, atomic binding forces develop at the interface between contact surface 12 and deformed ball 30, i.e., an integral connection is formed by using valence electron effects or a positive-locking connection or a combination of integral and positive-locking connection are formed between contacting wire 24 and contact surface 12. By subsequently lifting off wire-bonding device 18 from contact surface 12 (illustrated in FIG. 1d), contacting wire 24 tears off since a binding force between deformed ball 30, now designated as bump 32, and contact surface 12 is greater than the breaking load of contacting wire 24.

While tearing, contacting wire 24 is pulled out through wire-guiding opening 22 and reheated thermally. Due to this, in turn, a ball 30' is formed (FIG. 1e, FIG. 1f). As FIG. 1g illustrates, wire-bonding device 18 is subsequently moved in the direction of first contact surface 10 so that ball 30' comes into contact with contact surface 10 and is joined thereto under the influence of pressure and ultrasound. In the process, atomic binding forces develop at the interface between deformed ball 30' and contact surface 10 in a manner corresponding to the magnitude of contact force F' and of ultrasound power US.

In this context, a nail head 34 is formed on contact surface 10.

In a next process step, according to FIG. 1h, wire-bonding device 18 is displaced by moving it from contact surface 10 both upward and laterally in the direction of contact surface 12. These movements can be carried out one after the other or in a superimposing manner. In the process, contacting wire 34 is left loose so that is does not tear off. Contacting wire 24 is led to sewcond contact surface 12, forming a loop 36. Subsequently, wire-bonding device 18 is moved in the direction of contact surface 12. Due to this, contacting wire 24 comes into touching contact with bump 32. In this context, capillary mouthpiece 20 deforms bump 32 which develops according to FIG. 1d. By applying a contact force F" and ultrasound power US, contacting wire 24 is deformed together with peak 38 of bump 32 so that an integral connection is formed, for example gold to gold, between contacting wire 24, namely between loop 36 of contacting wire 24 and bump 32.

As FIG. 1k illustrates, loop 36 is contacted with bump 32 and via the bump with contacting surface 12 subsequent to lifting off wire-bonding device 18. In this manner, an electrical connection between contact surfaces 10 and 12 is made. The process sequence explained on the basis of FIGS. 1a through 1k is continually repeated, according to the number of contact surfaces to be contacted. These processes can be repeated with high precision in fast succession using computer-controlled wire-bonding devices 18.

While joining contacting wire 24 with bump 32 (FIG. 1i), contacting wire 24 is squeezed via capillary mouthpiece 20 so that a predetermined breaking point is formed which tears in response to lifting off capillary mouthpiece 20 (FIG. 1k).

On the basis of the explained process sequence, in particular in the views shown in FIGS. 1i and 1k, it becomes clear that contact point 40 at which the connection between loop 36 and contact surface 12 is made, ensues from a sandwich-like construction of contact surface 12, from bump 32 as contact metallization 42, and from a stitch 44 of loop 36. In this context, stitch 44 has a relatively small contact surface with bump 32, this contact surface being sufficient for maintaining a relatively large and, consequently, reliable contacting connection because of the identical material properties since bump 32 is made from contacting wire 24, as well. The connection to contact surface 12 of substrate 16 is carried out via the interface between bump 32 and contact surface 12. Due to the formation explained on the basis of FIGS. 1a through 1d, this interface has a relatively large surface, thus guaranteeing a reliable contacting.

The formation of the geometrical shape of bump 32 and stitch 44 can be influenced by a shaping of capillary mouthpiece 20 (generally bonding capillary). According to the formation of the mouth region of capillary mouthpiece 20, it is possible to produce the shape of peak 38 or also other suitable shape features (for example thickness and diameter) of bump 32 which allow an integral connection to stitch 44 in a simple manner but which also influence the positive locking interface connection of bump 32 to contact surface 12. Thus, the connection between loop 36 and contact surface 12 is in first place achieved via positive locking between bump 32 and contact surface 12, and only in second place via atomic binding forces (integral connection) between stitch 44 and bump 32.

The present is, of course, not limited to the represented exemplary embodiment. Thus, in particular, other structural designs of wire-bonding device 18 are possible, for example, in that construction of the capillary which carries out the deformation of bump 32 and/or of stitch 44, is structurally separated from the feed of contacting wire 24. In this manner, a construction of the positive locking between stitch 44 and bump 32 can be optimized independently of the feed of contacting wire 24.

Altogether, a so-called "ball-wedge connecting method" can be implemented with simple process steps, a so-called "ball-ball (wedge) connecting method" being implemented by the embodiment of the method according to the present invention.

The thermal energy required for the reliability when using conventional ball-wedge methods (heating of contact surfaces 10 and 12, or of substrates 14 and 16, respectively) is not necessarily required. Because of this, the universality of the method becomes clear since, in this manner, it is also possible to connect thermally sensitive or, due to construction, non-heatable contacts in components, devices and the like, using the method according to the present invention.

By suitably selecting contact force F and ultrasonic energy US, it is possible for sensitive contact surfaces 12 to be contacted in the process step according to FIG. 1c (lower surface pressure than it would be possible using direct stitch or wedge contacting). The, due to the method, elevated formation of the contacts bump 32 and wedge results in the possibility of contacting in cavities which are not possible for the conventional method because of the capillary dimensions.

Figure 2B:
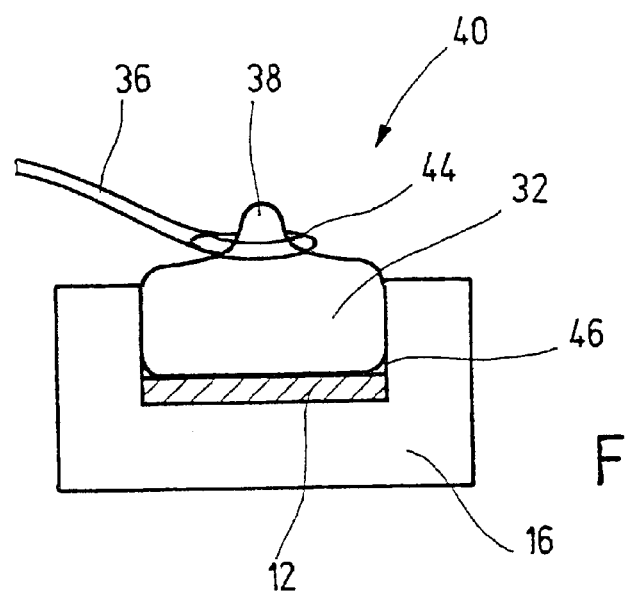
FIG. 2b shows another enlarged representation of a contact point.
Figure 2C:
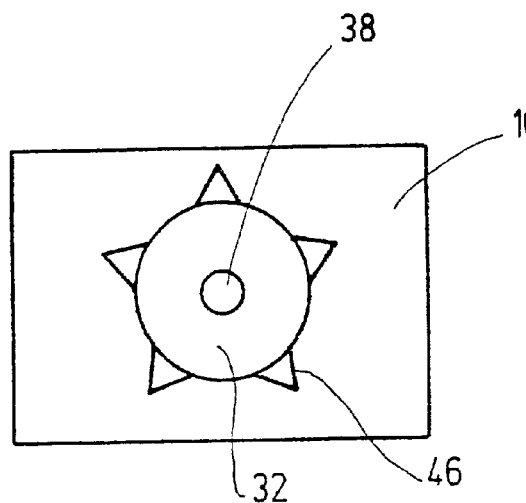
FIG. 2c shows another enlarged representation of a contact point.

On the basis of an enlarged representation of contact point 40 in FIGS. 2a through 2c, a positive-locking connection between bump 32 and contact surface 12 of substrate 16 is illustrated. In this context, a cavity 46 is indicated in substrate 16 which virtually constitutes a depression in substrate 16. In this context, the shape of cavity 46 is freely selectable and can be adapted preferably to a shape of a producible bump 38. As the schematic top view in FIG. 2c shows, it is possible for cavity 46 to have an irregular shape. In this manner, an improved positive locking between bump 38 and contact surface 12 of substrate 16 is possible. This improved positive locking, in turn, allows a more effective, in particular, stable interface connection between bump 38 and substrate 16, even if these are in principle not bondable or bondable only with great difficulty because of the given material properties. When forming cavity 46 appropriately, an integral connection between bump 38 and contact surface 12 can possibly be dispensed with completely. Then, an integral connection can be limited to the contacting of stitch 44 with bump 32.

What is claimed is:

1. A method for making an electrical connection between a first contact surface and a second contact surface, comprising the steps of:

produce a contact metallization composed of a material of a contacting wire on a first one of the first contact surface and the second contact surface using a wire-bonding device, wherein, by initially applying a thermal energy to a free end of the contacting wire, the free end is fused to form a ball;

subsequent to forming the ball, pressing the ball onto the first one of the first contact surface and the second contact surface in order to plastically deform the ball and form a flat-pressed ball having a peak, and in order to achieve a connection between the flat-pressed ball and the first one of the first contact surface and the second contact surface in first place by a positive locking; and subsequent to pressing the ball, arranging the contacting wire between the first contact surface and the second contact surface in accordance with an operation of the wire-bonding device by performing the steps of:

contacting the contacting wire initially with a second one of the first contact surface and the second contact surface and then with the peak of the flat-pressed ball, and subsequently cutting off the contacting wire in accordance with the operation of the wire-bonding device.

2. The method according to claim 1 wherein:

the at least one of the first contact surface and the second contact surface is heated only by the thermal energy inherent in the ball.

3. A method for making an electrical connection between a first contact surface and a second contact surface, comprising the steps of:

arranging a contacting wire between the first contact surface and the second contact surface in accordance with an operation of a wire-bonding device by performing the steps of:

contacting the contacting wire initially with the first contact surface and then with the second contact surface, and subsequently cutting off the contacting wire in accordance with the operation of the wire-bonding device;

producing a contact metallization composed of a material of the contacting wire on at least one of the first contact surface and the second contact surface using the wire-bonding device prior to the contacting step, wherein, by initially applying a thermal energy to a free end of the contacting wire, the free end is fused to form a ball; and subsequent to forming the ball, pressing the ball onto the at least one of the first contact surface and the second contact surface in order to plastically deform the ball and form a flat-pressed ball, and in order to achieve a connection between the flat-pressed ball and the at least one of the first contact surface and the second contact surface in first place by a positive locking;

wherein the step of pressing the ball is performed in a cavity of the at least one of the first contact surface and the second contact surface.

4. A method for making an electrical connection between a first contact surface and a second contact surface, comprising the steps of:

arranging a contacting wire between the first contact surface and the second contact surface in accordance with an operation of a wire-bonding device by performing the steps of:
contacting the contacting wire initially with the first contact surface and then with the second contact surface, and
subsequently cutting off the contacting wire in accordance with the operation of the wire-bonding device;

producing a contact metallization composed of a material of the contacting wire on at least one of the first contact surface and the second contact surface using the wire-bonding device prior to the contacting step, wherein, by initially applying a thermal energy to a free end of the contacting wire, the free end is fused to form a ball;

subsequent to forming the ball, pressing the ball onto the at least one of the first contact surface and the second contact surface in order to plastically deform the ball and form a flat-pressed ball, and in order to achieve a connection between the flat-pressed ball and the at least one of the first contact surface and the second contact surface in first place by a positive locking; and causing the wire-bonding device to stamp shape features onto the contact metallization, wherein:
the positive locking corresponds to a positive-locking interface connection of the contact metallization with the at least one of the first contact surface and the second contact surface,
the shape features achieve an integral connection with a stitch of the contacting wire, and
the shape features support the positive-locking interface connection of the contact metallization with the at least one of the first contact surface and the second contact surface.

5. A method for making an electrical connection between a first contact surface and a second contact surface, comprising the steps of:

arranging a contacting wire between the first contact surface and the second contact surface in accordance with an operation of a wire-bonding device by performing the steps of:
contacting the contacting wire initially with the first contact surface and, then with the second contact surface, and
subsequently cutting off the contacting wire in accordance with the operation of the wire-bonding device;

producing a contact metallization composed of a material of the contacting wire on at least one of the first contact surface and the second contact surface using the wire-bonding device prior to the contacting step, wherein, by initially applying a thermal energy to a free end of the contacting wire, the free end is fused to form a ball;

subsequent to forming the ball, pressing the ball onto the at least one of the first contact surface and the second contact surface in order to plastically deform the ball and form a flat-pressed ball, and in order to achieve a connection between the flat-pressed ball and the at least one of the first contact surface and the second contact surface in first place by a positive locking; and pressing the contacting wire onto the contact metallization by the wire-bonding device while applying a contact force and an ultrasonic energy, the contact force and the ultrasonic energy being selected such that a predetermined breaking point is formed at the contacting wire at which the contacting wire tears off subsequent to a lifting off of the wire-bonding device.

6. A method for making an electrical connection between a first contact surface and a second contact surface, comprising the steps of:

producing a contact metallization composed of a material of a contacting wire on at least one of the first contact surface and the second contact surface using a wire-bonding device, wherein, by initially applying a thermal energy to a free end of the contacting wire, the free end is fused to form a ball;

subsequent to forming the ball, pressing the ball onto the at least one of the first contact surface and the second contact surface in order to plastically deform the ball and form a flat-pressed ball, and in order to achieve a connection between the flat-pressed ball and the at least one of the first contact surface and the second contact surface in first place by a positive locking;

arranging a contacting wire between the first contact surface and the second contact surface in accordance with an operation of a wire-bonding device by performing the steps of:
contacting the contacting wire initially with the first contact surface and then with the second contact surface; and
pressing the contacting wire onto the contact metallization by the wire-bonding device while applying a contact force and an ultrasonic energy, the contact force and the ultrasonic energy being selected such that a predetermined breaking point is formed at the contact wire at which the contacting wire tears off subsequent to a lifting off of the wire-bonding device.

* * * * *